United States Patent
Takeda et al.

(10) Patent No.: US 10,073,360 B2
(45) Date of Patent: Sep. 11, 2018

(54) EDGE EXPOSURE APPARATUS

(71) Applicant: Mitsubishi Electric Corporation, Tokyo (JP)

(72) Inventors: Naoyuki Takeda, Tokyo (JP); Shoichi Kuga, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/541,636

(22) PCT Filed: Jan. 28, 2015

(86) PCT No.: PCT/JP2015/052294
§ 371 (c)(1),
(2) Date: Jul. 5, 2017

(87) PCT Pub. No.: WO2016/121023
PCT Pub. Date: Aug. 4, 2016

(65) Prior Publication Data
US 2018/0024437 A1    Jan. 25, 2018

(51) Int. Cl.
*G03F 7/20* (2006.01)
*H01L 21/67* (2006.01)

(52) U.S. Cl.
CPC ......... *G03F 7/70825* (2013.01); *G03F 7/708* (2013.01); *G03F 7/7015* (2013.01); *G03F 7/70266* (2013.01); *G03F 7/70308* (2013.01); *G03F 7/70433* (2013.01); *G03F 7/70808* (2013.01); *H01L 21/67259* (2013.01)

(58) Field of Classification Search
None
See application file for complete search history.

(56) References Cited

U.S. PATENT DOCUMENTS

2002/0155392 A1  10/2002  Arao
2002/0168191 A1  11/2002  Fukuda et al.
2003/0232282 A1  12/2003  Tsai
2012/0064256 A1   3/2012  Higashijima et al.

FOREIGN PATENT DOCUMENTS

JP    S62-142321 A    6/1987
JP    H03-106730 U1   11/1991
JP    H07-161628 A    6/1995
(Continued)

OTHER PUBLICATIONS

International Search Report issued in PCT/JP2015/052294; dated Apr. 14, 2015.
(Continued)

*Primary Examiner* — Michelle M Iacoletti
(74) *Attorney, Agent, or Firm* — Studebaker & Brackett PC

(57) ABSTRACT

An edge exposure apparatus for exposure of an outer circumferential portion of a semiconductor substrate to light includes a light source provided to be able to emit light to the outer circumferential portion and a mirror having a reflection surface arranged to extend in a direction intersecting with an optical axis of light emitted from the light source. The mirror is provided between the outer circumferential portion and a center of the semiconductor substrate in a radial direction of the semiconductor substrate in exposure of the outer circumferential portion of the semiconductor substrate to light.

8 Claims, 3 Drawing Sheets

(56) References Cited

FOREIGN PATENT DOCUMENTS

| | | |
|---|---|---|
| JP | H07-192993 A | 7/1995 |
| JP | H09-283396 A | 10/1997 |
| JP | H11-214294 A | 8/1999 |
| JP | 2001-068393 A | 3/2001 |
| JP | 2001-196298 A | 7/2001 |
| JP | 2003-164789 A | 6/2003 |
| JP | 2012-084856 A | 4/2012 |

OTHER PUBLICATIONS

An Office Action; "Notice of Reasons for Refusal," mailed by the Japanese Patent Office dated Apr. 18, 2018, which corresponds to Japanese Patent Application No. 2016-571571 and is related to U.S. Appl. No. 15/541,636; with English translation.

EDGE EXPOSURE APPARATUS

TECHNICAL FIELD

The present invention relates to an edge exposure apparatus for exposure of an outer circumferential portion of a semiconductor substrate to light.

BACKGROUND ART

In a process for manufacturing a semiconductor device, in general, a photolithography step is performed on a semiconductor substrate a plurality of times. In the photolithography step, a mask pattern for etching a specific portion on the semiconductor substrate or for implanting ions is formed. The mask pattern is formed with a photosensitive material such as a resist.

The photosensitive material is generally applied onto the semiconductor substrate through spin coating. In spin coating, for example, a coating material is dropped onto the center of the rotating semiconductor substrate and the coating material is spread by centrifugal force. Therefore, the coating material is applied also to an outer circumferential portion of the semiconductor substrate. When a beveled portion (a portion inclined as a result of beveling) is formed in the outer circumferential portion of the semiconductor substrate, the coating material is applied also onto the beveled portion.

The mask pattern made of the photosensitive material formed on the outer circumferential portion or the beveled portion as such is broken due to contact in a cassette accommodating the semiconductor substrate or in a semiconductor manufacturing apparatus and becomes a source of generation of particles.

In order to address such a problem, Japanese Patent Application No. 60-283613 (Japanese Patent Laying-Open No. 62-142321) describes an exposure apparatus which exposes to light, only an end portion of a semiconductor substrate having a resist prominence formed at the end portion. Japanese Patent Application No. 10-025183 (Japanese Patent Laying-Open No. 11-214294) describes an edge exposure apparatus which exposes only a peripheral portion of a stepped wafer such as an SOI wafer to light.

When a coating material is applied to a rear surface of a stepped substrate having a step portion (a rib portion projecting from an inner circumferential portion on a rear surface side) formed in an outer circumferential portion as a result of treatment for decrease in thickness of an inner circumferential portion of the semiconductor substrate, the coating material is also applied onto the step portion. The coating material is applied also onto an inner circumferential end surface located on an inner circumferential side in the step portion and a terrace surface (a top surface of the step portion).

CITATION LIST

Patent Document

PTD 1: Japanese Patent Application No. 60-283613 (Japanese Patent Laying-Open No. 62-142321)
PTD 2: Japanese Patent Application No. 10-025183 (Japanese Patent Laying-Open No. 11-214294)

SUMMARY OF INVENTION

Technical Problem

It is difficult, however, to apply the conventional technique described above to a substrate with a step portion. Specifically, since a photosensitive film formed on an inner circumferential end surface of the step portion cannot sufficiently be exposed to light, the photosensitive film cannot sufficiently be removed through development. Consequently, the photosensitive film becomes a source of generation of particles in a subsequent step and the substrate with the step portion itself or a semiconductor manufacturing apparatus is contaminated.

The present invention was made to solve the problems as described above. A primary object of the present invention is to provide an edge exposure apparatus which can expose to light, a photosensitive film formed on an inner circumferential end surface of a step portion of a semiconductor substrate, to such an extent as sufficiently allowing removal of the photosensitive film through development.

Solution to Problem

An edge exposure apparatus according to the present invention is an edge exposure apparatus for exposure of an outer circumferential portion of a semiconductor substrate to light, and includes a light source provided to be able to emit light to the outer circumferential portion and a mirror having a reflection surface formed to extend in a direction intersecting with an optical axis of the light emitted from the light source. The mirror is provided between the outer circumferential portion and a center of the semiconductor substrate in a radial direction of the semiconductor substrate in exposure of the outer circumferential portion of the semiconductor substrate to light.

Advantageous Effects of Invention

According to the present invention, since an inner circumferential end surface of a step portion of a semiconductor substrate can be irradiated with light reflected by a mirror, an edge exposure apparatus which can sufficiently expose to light, a photosensitive film formed on the inner circumferential end surface, to such an extent as allowing removal of the photosensitive film through development can be provided.

DESCRIPTION OF EMBODIMENTS

Figure 1:
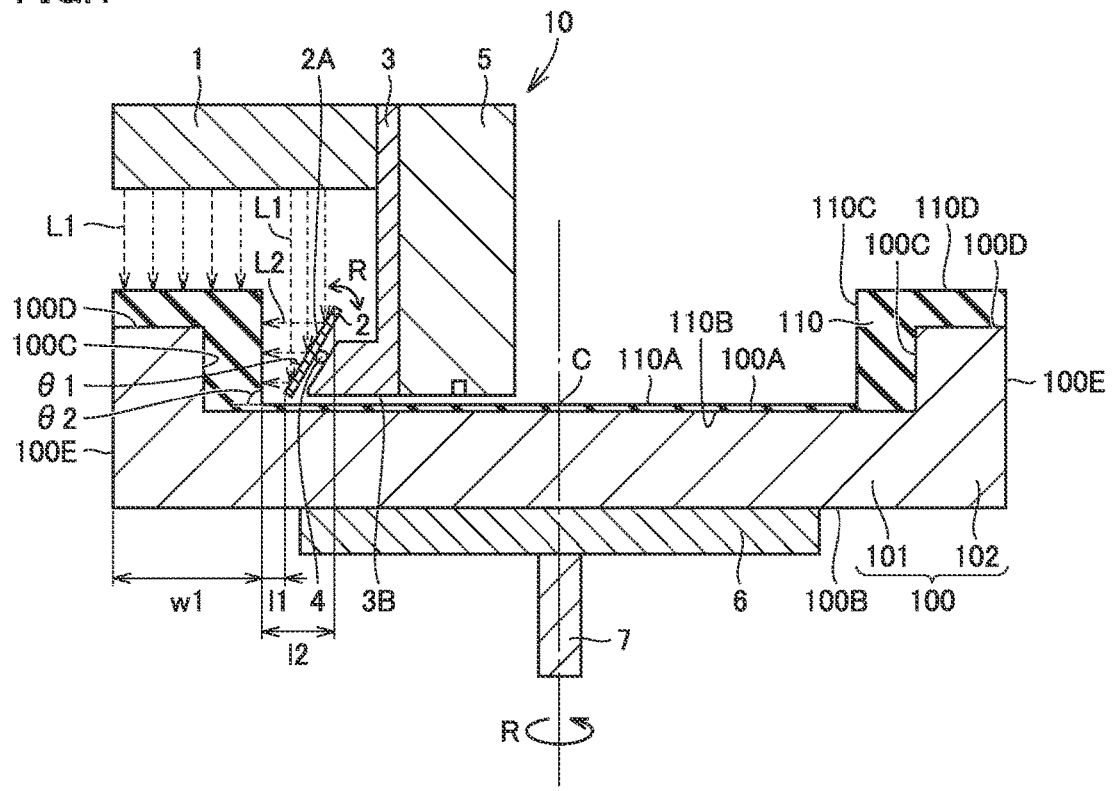
FIG. 1 is a cross-sectional view for illustrating an edge exposure apparatus according to the present embodiment.

An embodiment of the present invention will be described hereinafter with reference to the drawings. The same or corresponding elements in the drawings below have the same reference characters allotted and description thereof will not be repeated.

A semiconductor substrate 100 to be processed by an edge exposure apparatus 10 according to the present embodiment will initially be described with reference to FIG. 1. FIG. 1 is a cross-sectional view for illustrating a construction of edge exposure apparatus 10 according to the present embodiment and semiconductor substrate 100 to be exposed to light by the edge exposure apparatus.

Semiconductor substrate 100 to be exposed to light by edge exposure apparatus 10 has a first main surface 100A and has a projecting step portion 102 around an outer circumference of first main surface 100A. In other words, semiconductor substrate 100 has an inner circumferential portion (flat portion) 101 having first main surface 100A and an outer circumferential portion (step portion) 102 formed to surround flat portion 101 on an outer circumferential side.

Semiconductor substrate 100 further has a second main surface 100B located opposite to first main surface 100A, and the second surface is a surface continuous from flat portion 101 to step portion 102. Semiconductor substrate 100 has a top surface 100D in step portion 102 which is located opposite to second main surface 100B. Semiconductor substrate 100 further has an inner circumferential end surface 100C which is located on an inner circumferential side of step portion 102, extends in a direction intersecting with first main surface 100A, and is continuous to first main surface 100A and top surface 100D. Inner circumferential end surface 100C is formed as being continuous in a circumferential direction when semiconductor substrate 100 is two-dimensionally viewed. A distance between first main surface 100A and top surface 100D in a direction perpendicular to first main surface 100A is set, for example, 680 µm.

For example, a resist 110 is formed as a photosensitive film on first main surface 100A, inner circumferential end surface 100C, and top surface 100D of semiconductor substrate 100. Resist 110 has a third main surface 110A formed on flat portion 101 of semiconductor substrate 100 substantially in parallel to first main surface 100A, an end surface 110C which is continuous to third main surface 110A and extends in a direction intersecting with third main surface 110A, and a top surface 110D which is continuous to end surface 110C and located at a prescribed height from third main surface 110A. Each surface of semiconductor substrate 100 or resist 110 does not have to be planar but may be curved.

Figure 2:
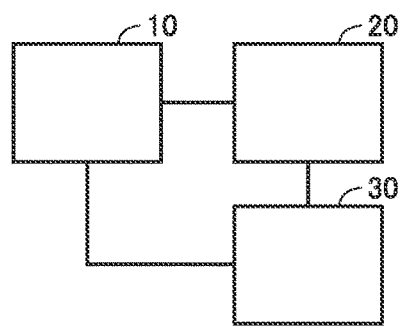
FIG. 2 is a block diagram for illustrating the edge exposure apparatus according to the present embodiment.

Edge exposure apparatus 10 according to the present embodiment will now be described with reference to FIGS. 1 and 2. FIG. 2 is a block diagram for illustrating edge exposure apparatus 10 according to the present embodiment. Edge exposure apparatus 10 includes a control unit 20 controlling relative positional relation between edge exposure apparatus 10 and semiconductor substrate 100 and a drive portion 30 driving a chuck table 6 carrying edge exposure apparatus 10 or semiconductor substrate 100. Edge exposure apparatus 10 further includes a light source 1 and a mirror 2. Edge exposure apparatus 10 further includes chuck table 6 provided to be able to carry semiconductor substrate 100 and a rotation shaft 7 around which chuck table 6 can rotate.

Light source 1 and mirror 2 are provided to be able to expose to light, a portion of resist 110 to be exposed to light (resist 110 formed on step portion 102) under such a condition that resist 110 can be removed evenly through development.

Light source 1 is provided to be able to emit light from a side of first main surface 100A toward step portion 102 of semiconductor substrate 100. Light source 1 should only be selected as appropriate in accordance with a wavelength to which applied resist 110 (a photosensitive film) has sensitivity or sensitivity of the resist, and it may be, for example, a light source which can emit g rays of a high-pressure mercury lamp (having a wavelength of 436 nm), h rays of a high-pressure mercury lamp (having a wavelength of 405 nm), and i rays of a high-pressure mercury lamp (having a wavelength of 365 nm). Alternatively, light source 1 may be semiconductor laser (having wavelengths of 830 nm, 532 nm, 488 nm, and 405 nm), YAG laser (having a wavelength of 1064 nm), KrF excimer laser (having a wavelength of 248 nm), ArF excimer laser (having a wavelength of 193 nm), or F2 excimer laser (having a wavelength of 157 nm). Light source 1 is provided such that an optical axis L1 of emitted light extends in a direction intersecting with first main surface 100A and top surface 100D, and provided, for example, such that optical axis L1 is perpendicular to first main surface 100A and top surface 100D.

Light source 1 is provided to be able to project light onto a region wider than a width w1 of resist 110 (a maximum distance between an outer circumferential end surface 100E of semiconductor substrate 100 and end surface 110C) formed on step portion 102, in a radial direction of semiconductor substrate 100. Specifically, in consideration of a distance (a shortest distance between a reflection surface 2A of mirror 2 and end surface 110C) in the radial direction between an end portion (an end portion located on the outer circumferential side of semiconductor substrate 100) of reflection surface 2A of mirror 2 and a point of intersection between third main surface 110A and end surface 110C in exposure of resist 110 on step portion 102 to light, a width of a region on which light can be projected by light source 1 is greater than width w1 by at least a distance 11. As compared with width w1, the width of the region on which light can be projected by light source 1 is as great as a distance 12 in the radial direction, for example, between an end portion (an end portion located on the inner circumferential side of semiconductor substrate 100) of reflection surface 2A and the point of intersection between third main surface 110A and end surface 110C. Distance 11 can arbitrarily be determined in accordance with a size of a region where resist 110 should remain on first main surface 100A.

Mirror 2 includes reflection surface 2A arranged to extend in the direction intersecting with optical axis L1 of light emitted from light source 1. Mirror 2 is arranged on the inner circumferential side relative to step portion 102. Mirror 2 is provided to be able to reflect at reflection surface 2A, light emitted from light source 1 toward inner circumferential end surface 100C. From a different point of view, mirror 2 is provided between step portion 102 and a center C of semiconductor substrate 100 in the radial direction of semiconductor substrate 100 in exposure of the outer circumferential portion of semiconductor substrate 100 to light. Mirror 2 is arranged such that reflection surface 2A is opposed to end surface 110C and inner circumferential end surface 100C. Mirror 2 is supported on a mirror support base 3. Reflection surface 2A of mirror 2 is preferably provided to reflect light emitted from light source 1 such that a wide region of end surface 110C (a region which is less likely to be directly exposed to light having optical axis L1 emitted from light source 1) can be irradiated with reflected light. So long as reflection surface 2A is provided to be able to reflect light emitted from light source 1 only toward a prescribed region, it may be a surface having a scattering function (for example, a surface including irregularities), however, it is preferably a mirror surface. Reflection surface 2A may be planar or have a curved portion.

Mirror support base 3 is located on the inner circumferential side relative to step portion 102 and provided to be able to position mirror 2 with respect to semiconductor substrate 100 such that reflection surface 2A is opposed to end surface 110C and inner circumferential end surface 100C. Mirror support base 3 can support mirror 2 in a region located between top surface 100D of step portion 102 and first main surface 100A in the direction perpendicular to first main surface 100A. Mirror support base 3 can support mirror 2 in a region located between inner circumferential end surface 100C of step portion 102 and center C of semiconductor substrate 100 in the radial direction of semiconductor substrate 100. Mirror support base 3 is connected to drive portion 30 and provided to be movable relatively to chuck table 6 based on a signal from drive portion 30.

An angle of inclination θ1 of reflection surface 2A with respect to optical axis L1 is determined in accordance with an angle formed between end surface 110C and first main surface 100A from a point of view of effective exposure of end surface 110C to light. Preferably, mirror 2 is supported on mirror support base 3 such that angle of inclination θ1 is variable. Mirror support base 3 is preferably provided to be able to support mirror 2 such that angle θ1 of reflection surface 2A with respect to optical axis L1 of light is variable. From a different point of view, mirror support base 3 is preferably provided to be able to vary a direction in which an optical axis L2 of light reflected by reflection surface 2A extends. In this case, mirror 2 is carried on a mirror movable portion 4 provided on mirror support base 3. Mirror movable portion 4 is provided to be able to pivot mirror 2, for example, such that angle of inclination θ1 is not smaller than 30 degrees and not greater than 80 degrees. Any conventionally well-known feature can be made use of as mirror movable portion 4.

Edge exposure apparatus 10 preferably further includes a detection portion which can detect a distance between mirror 2 or mirror support base 3 and semiconductor substrate 100. The detection portion includes a first sensor 5 which can detect a distance between mirror 2 and an inner circumferential portion of semiconductor substrate 100 (first main surface 100A or third main surface 110A) in a direction of thickness of semiconductor substrate 100.

Any contactless sensor may be adopted as first sensor 5, and for example, an optical sensor or an ultrasonic sensor may be adopted. When an optical sensor is adopted as sensor 5, sensor 5 includes a light projection portion having a light emitting element such as a laser diode or an LED and a light reception portion having a light reception element such as a photodiode, a CMOS, or a CCD. Sensor 5 is provided, for example, integrally with mirror support base 3. In this case, the light reception portion (detection portion) of first sensor 5 is arranged flush with a lower surface of mirror support base 3. Sensor 5 is provided, for example, in a portion in mirror support base 3 most proximate to first main surface 100A, or a portion of a member provided integrally with mirror support base 3 equal to the most proximate portion in distance from first main surface 100A. First sensor 5 is connected to control unit 20. Control unit 20 controls drive by drive portion 30 based on a result of detection by first sensor 5.

Sensor 5 may be provided integrally with mirror 2. Sensor 5 is provided to be able to detect, for example, a distance between mirror 2 and first main surface 100A or third main surface 110A in the direction perpendicular to first main surface 100A.

Chuck table 6 is provided to vacuum-chuck second main surface 100B of semiconductor substrate 100. The center of chuck table 6 in a direction along second main surface 100B is connected to rotation shaft 7. Chuck table 6 is provided as being rotatable around rotation shaft 7 while semiconductor substrate 100 is vacuum-chucked.

Mirror support base 3 and chuck table 6 are provided such that at least any one of them can move relatively to the other. For example, when chuck table 6 is fixed in the direction perpendicular to first main surface 100A while chuck table 6 vacuum-chucks semiconductor substrate 100 in edge exposure apparatus 10, mirror support base 3 is provided to be movable with respect to semiconductor substrate 100 in the direction perpendicular at least to first main surface 100A. Mirror support base 3 is preferably provided to be movable relatively to chuck table 6, for example, such that a distance between mirror 2 and third main surface 110A of semiconductor substrate 100 detected by sensor 5 is not greater than 1 mm.

As shown in FIG. 1, light source 1 and mirror support base 3 may integrally be provided. In this case, light source 1 and mirror support base 3 may be provided as being movable integrally with respect to semiconductor substrate 100. When chuck table 6 is not provided as being rotatable around rotation shaft 7, light source 1 and mirror support base 3 may be provided as being rotatable in a plane in parallel to first main surface 100A with the center of semiconductor substrate 100 being defined as the center of rotation.

Figure 3:
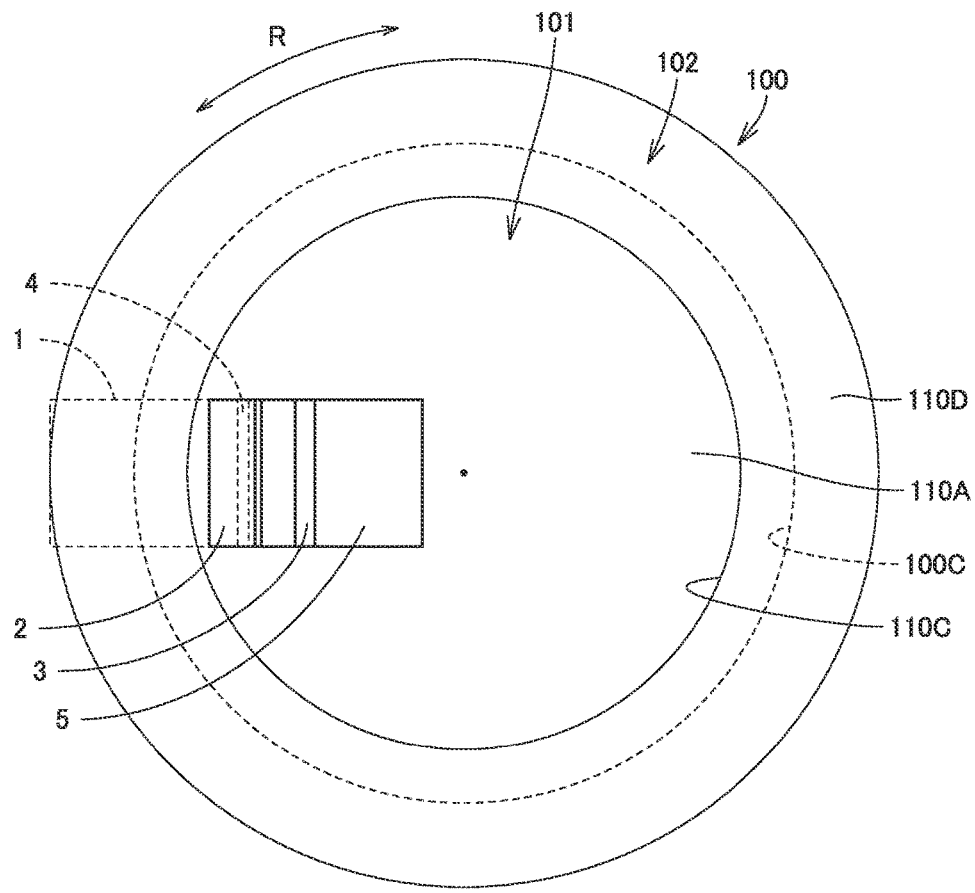
FIG. 3 is a top view for illustrating the edge exposure apparatus according to the present embodiment.

FIG. 3 is a top view for illustrating the edge exposure apparatus according to the present embodiment. Referring to FIG. 3, light source 1, mirror 2, mirror support base 3, mirror movable portion 4, and first sensor 5 located on the side of first main surface 100A of semiconductor substrate 100 should only be provided to be able to be opposed to at least a part of inner circumferential end surface 100C formed as being continuous in the circumferential direction of semiconductor substrate 100. By doing so as well, as chuck table 6 rotates in the circumferential direction, entire inner circumferential end surface 100C of semiconductor substrate 100 carried on chuck table 6 can be exposed to light. Light source 1, mirror 2, mirror support base 3, mirror movable portion 4, and first sensor 5 may be provided to be able to be opposed to entire inner circumferential end surface 100C formed as being continuous in the circumferential direction of semiconductor substrate 100.

A function and effect of edge exposure apparatus 10 according to the present embodiment will now be described.

Edge exposure apparatus 10 according to the present embodiment is an edge exposure apparatus for exposing the outer circumferential portion of semiconductor substrate 100 to light, and includes light source 1 provided to be able to emit light to the outer circumferential portion and mirror 2 having reflection surface 2A formed to extend in the direction intersecting with the optical axis of light emitted from light source 1. Mirror 2 is provided between the outer circumferential portion and center C of semiconductor substrate 100 in the radial direction of semiconductor substrate 100 in exposure of the outer circumferential portion of semiconductor substrate 100 to light.

Such edge exposure apparatus 10 can emit light to top surface 100D of step portion 102 provided in the outer circumferential portion of semiconductor substrate 100 and can irradiate inner circumferential end surface 100C of step portion 102 with light emitted from light source 1 to mirror 2 and reflected by the mirror. Therefore, according to edge exposure apparatus 10, not only resist 110 formed on top surface 100D but also a photosensitive film (resist 110) having end surface 110C on inner circumferential end surface 100C can be exposed to light. Edge exposure apparatus 10 can expose to light, the entire portion of resist 110 which is formed on step portion 102 and may be a source of generation of particles. Consequently, the portion of resist 110 can be removed through development, and occurrence of such a problem as contamination of semiconductor substrate 100 itself or a semiconductor manufacturing apparatus in a subsequent step can be suppressed.

Figure 4:
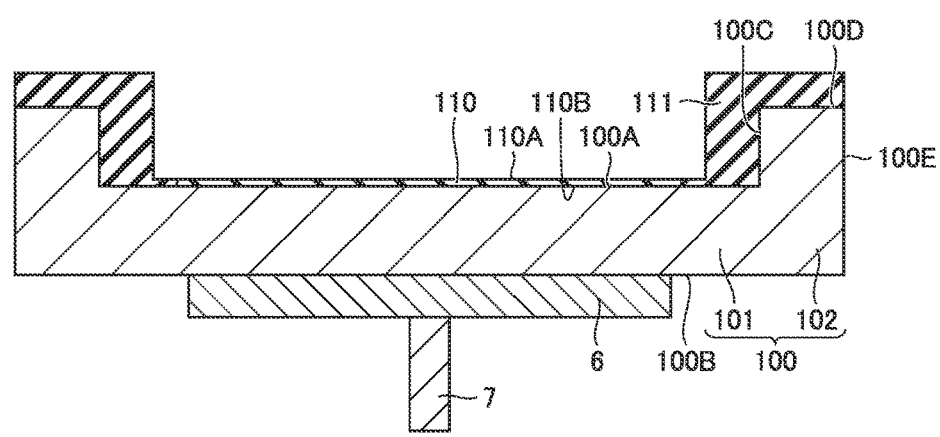
FIG. 4 is a cross-sectional view for illustrating a semiconductor substrate exposed to light by the edge exposure apparatus according to the present embodiment.

FIG. 4 is a cross-sectional view for illustrating semiconductor substrate 100 exposed to light by edge exposure apparatus 10 according to the present embodiment. Referring to FIG. 4, edge exposure apparatus 10 can expose to light, resist 110 formed on step portion 102 (inner circumferential end surface 100C and top surface 100D) and a part of resist 110 on the outer circumferential side formed on first main surface 100A of flat portion 101. A resist region 111 thus exposed to light includes the entire portion of resist 110 which is formed on step portion 102 and may be a source of generation of particles.

Figure 5:
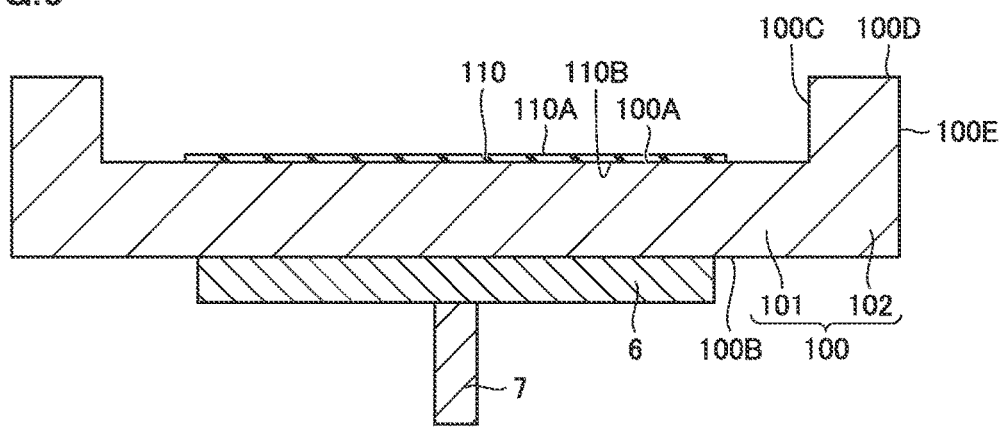
FIG. 5 is a cross-sectional view for illustrating the semiconductor substrate exposed to light and developed by the edge exposure apparatus according to the present embodiment.

FIG. 5 is a cross-sectional view for illustrating semiconductor substrate 100 exposed to light and thereafter developed by edge exposure apparatus 10 according to the present embodiment. Referring to FIG. 5, in semiconductor substrate 100 exposed to light and thereafter developed by edge exposure apparatus 10, resist region 111 exposed to light has been removed through development. Therefore, semiconductor substrate 100 can be processed by using resist 110 which remains on first main surface 100A in a subsequent step and generation of particles resulting from resist 110 formed on step portion 102 is suppressed. Consequently, with semiconductor substrate 100, a semiconductor device can be manufactured at high yield.

Edge exposure apparatus 10 preferably further includes a detection portion (having first sensor 5) which can detect a distance between mirror 2 and semiconductor substrate 100.

By doing so, contact between mirror 2 and semiconductor substrate 100 can be prevented by positioning mirror support base 3 or chuck table 6 based on a result of detection by the detection portion, and a distance between mirror 2 and semiconductor substrate 100 can be set to sufficiently be short. Specifically, by changing relative positional relation between mirror 2 and semiconductor substrate 100 based on a distance between mirror 2 and semiconductor substrate 100 in the direction perpendicular to first main surface 100A detected by first sensor 5, mirror 2 and semiconductor substrate 100 can sufficiently be close to each other in the direction perpendicular to first main surface 100A while contact between mirror 2 and semiconductor substrate 100 is avoided. Therefore, exposure also of resist 110 in a region where the resist should remain such as resist 110 formed in a region superimposed on mirror 2 or mirror support base 3, for example, in a direction along optical axis L1 to light reflected from inner circumferential end surface 100C of step portion 102 or light reflected from reflection surface 2A of mirror 2 can be suppressed.

Edge exposure apparatus 10 further includes mirror support base 3 which can support mirror 2 such that reflection surface 2A is opposed to inner circumferential end surface 100C. The mirror support base has mirror movable portion 4 which can vary an angle of reflection surface 2A with respect to optical axis L1 of light emitted from light source 1.

Thus, mirror 2 can be arranged with respect to semiconductor substrate 100 such that light reflected by mirror 2 is not cut off by the time it reaches resist 110 formed on inner circumferential end surface 100C. Consequently, edge exposure apparatus 10 can expose to light, the entire portion of resist 110 which is formed on step portion 102 and may be a source of generation of particles. A condition for exposure to light of the entire portion of resist 110 to be exposed to light including end surface 110C can be optimized by varying angle θ1 of reflection surface 2A of mirror 2 in accordance with an angle of inclination θ2 (see FIG. 1) of end surface 110C of resist 110. Consequently, as compared with an example in which angle θ1 is not variable and a condition for exposure is not optimal, an exposure time period necessary for exposing the entire portion of resist 110 to light in an exposure amount necessary for allowing removal of the resist through development can be shorter.

First sensor 5 included in the detection portion may be arranged flush with the lower surface of mirror support base 3. By doing so, contact between mirror support base 3 and semiconductor substrate 100 can be prevented and mirror 2 and mirror support base 3 can sufficiently be close to semiconductor substrate 100 in the direction perpendicular to first main surface 100A.

In edge exposure apparatus 10, light source 1 and mirror support base 3 may be provided as being integrally movable with respect to semiconductor substrate 100.

By doing so, an apparatus construction can be more simplified than in an example in which each of light source 1 and mirror support base 3 has a drive mechanism, and cost for manufacturing edge exposure apparatus 10 can be reduced. The number of control parameters associated with relative positional relation between light source 1 and mirror 2 can be reduced.

The detection portion preferably includes first sensor 5 which can detect a distance between mirror 2 and the inner circumferential portion surrounded by the outer circumferential portion in semiconductor substrate 100 in the direction of thickness of semiconductor substrate 100.

By doing so, mirror 2 can sufficiently be close to semiconductor substrate 100 in the direction perpendicular to first main surface 100A based on a distance detected by first sensor 5 as described above. Therefore, exposure also of resist 110 in a region where the resist should remain such as resist 110 formed in a region superimposed on mirror 2 or mirror support base 3, for example, in the direction along optical axis L1 to light reflected from inner circumferential end surface 100C of step portion 102 or light reflected from reflection surface 2A of mirror 2 can be suppressed.

Edge exposure apparatus 10 preferably further includes a substrate support base (chuck table 6) which rotatably supports semiconductor substrate 100.

By doing so, resist 110 formed on step portion 102 formed as being continuous in the circumferential direction can be exposed to light without rotating light source 1 and mirror 2, for example, along the circumferential direction of semiconductor substrate 100.

Figure 6:
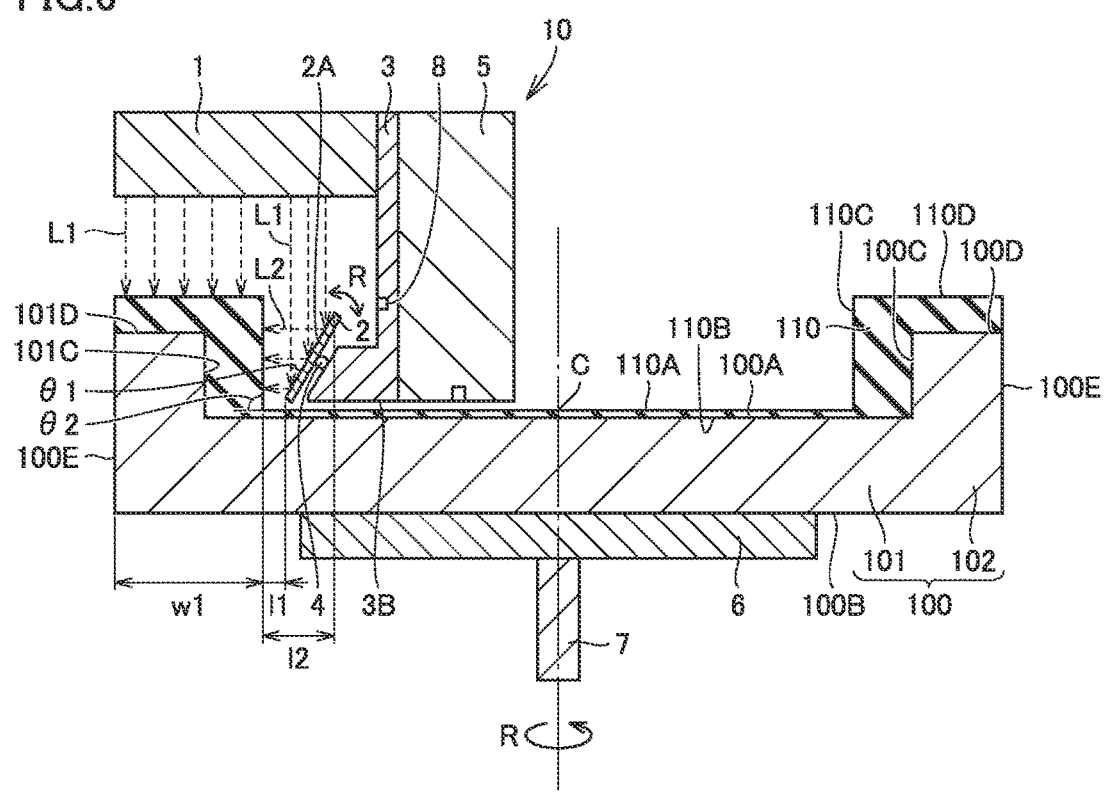
FIG. 6 is a cross-sectional view for illustrating a modification of the edge exposure apparatus according to the present embodiment.

FIG. 6 is a cross-sectional view showing a modification of edge exposure apparatus 10 according to the present embodiment. Referring to FIG. 6, though the detection portion is constructed basically as in edge exposure apparatus 10 shown in FIG. 1, it may include a second sensor 8 which can detect a distance between mirror 2 and the outer circumferential portion of semiconductor substrate 100 in the radial direction. Second sensor 8 is provided to be able to detect a distance in the direction along first main surface 100A between mirror 2 or mirror support base 3 and inner circumferential end surface 100C of semiconductor substrate 100 or end surface 110C (for example, shortest distance l1) or contact between mirror 2 and inner circumferential end surface 100C or end surface 110C. By doing so, distance l1 described above can be controlled by changing relative positional relation between mirror 2 and semiconductor substrate 100 based on a distance between mirror 2 and the outer circumferential portion (step portion 102) of semiconductor substrate 100 in the radial direction detected by second sensor 8 and mirror 2 can sufficiently be close to end surface 110C in the radial direction. Therefore, exposure to light of resist 110 in a region where the resist should remain on first main surface 100A can be suppressed. Similarly to first sensor 5, any contactless sensor may be adopted as second sensor 8, and for example, an optical sensor or an ultrasonic sensor may be adopted.

Though the embodiment of the present invention has been described as above, it should be understood that the embodiment disclosed herein is illustrative and non-restrictive in every respect. The scope of the present invention is defined by the terms of the claims and is intended to include any modifications within the scope and meaning equivalent to the terms of the claims.

INDUSTRIAL APPLICABILITY

The present invention is particularly advantageously applied to an exposure apparatus for exposure to light of an outer circumferential portion of a semiconductor substrate having a step portion in the outer circumferential portion.

REFERENCE SIGNS LIST 1 light source; 2 mirror; 2A reflection surface; 3 mirror support base; 4 mirror movable portion; 5 first sensor; 6 chuck table; 7 rotation shaft; 8 second sensor; 10 edge exposure apparatus; 100 semiconductor substrate; 100A first main surface; 100B second main surface; 100C inner circumferential end surface; 100D, 110D top surface; 100E outer circumferential end surface; 101 flat portion; 102 step portion; 110 resist; 110A third main surface; and 110C inclined surface.

The invention claimed is:

1. An edge exposure apparatus for exposure of an outer circumferential portion of a semiconductor substrate to light, comprising:
 a light source provided to be able to emit light to the outer circumferential portion;
 a mirror having a reflection surface arranged to extend in a direction intersecting with an optical axis of the light emitted from the light source, the mirror being provided between the outer circumferential portion and a center of the semiconductor substrate in a radial direction of the semiconductor substrate in exposure of the outer circumferential portion of the semiconductor substrate to light; and
 a detection portion which is configured to detect a distance between the mirror and the semiconductor substrate.

2. The edge exposure apparatus according to claim 1, further comprising a mirror support base which is configured to support the mirror, wherein
 the mirror support base has a mirror movable portion which is configured to vary an angle of the reflection surface with respect to the optical axis of the light.

3. The edge exposure apparatus according to claim 2, wherein
 the detection portion is arranged flush with a lower surface of the mirror support base.

4. The edge exposure apparatus according to claim 2, wherein
 the detection portion is connected to the mirror support base.

5. The edge exposure apparatus according to claim 2, wherein
 the light source and the mirror support base are provided so as to be integrally movable with respect to the semiconductor substrate.

6. The edge exposure apparatus according to claim 1, wherein
 the detection portion includes a first sensor which is configured to detect a distance between the mirror and an inner circumferential portion surrounded by the outer circumferential portion in the semiconductor substrate, in a direction of thickness of the semiconductor substrate.

7. The edge exposure apparatus according to claim 1, wherein
 the detection portion includes a second sensor which is configured to detect a distance between the mirror and the outer circumferential portion in the radial direction of the semiconductor substrate.

8. The edge exposure apparatus according to claim 1, further comprising a substrate support base rotatably supporting the semiconductor substrate.

* * * * *